United States Patent
Fujino et al.

(10) Patent No.: US 6,404,695 B1
(45) Date of Patent: Jun. 11, 2002

(54) SEMICONDUCTOR MEMORY DEVICE INCLUDING A PLURALITY OF MEMORY BLOCKS ARRANGED IN ROWS AND COLUMNS

(75) Inventors: Takeshi Fujino; Akira Yamazaki, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/877,026

(22) Filed: Jun. 11, 2001

(30) Foreign Application Priority Data

Feb. 2, 2001 (JP) ........................................ 2001-026388

(51) Int. Cl.[7] ................................................. G11C 8/00
(52) U.S. Cl. ............................ 365/230.03; 365/230.06; 365/63
(58) Field of Search ....................... 365/230.03, 230.06, 365/51, 63

(56) References Cited

U.S. PATENT DOCUMENTS 5,822,268 A   10/1998   Kirihata
5,949,732 A   9/1999    Kirihata
6,147,925 A * 11/2000   Tomishima et al. ......... 365/100

FOREIGN PATENT DOCUMENTS

JP            11-126477            5/1999

* cited by examiner

Primary Examiner—Huan Hoang
(74) Attorney, Agent, or Firm—McDermott, Will & Emery

(57) ABSTRACT

A DRAM includes two main column selecting lines provided at each sense amplifier zone, eight sub column selecting lines provided at each sense amplifier zone to correspond to each memory block, two sub decoder column selecting lines provided at each sub decoder zone, a sub column decoder provided at each crossing portion of the sense amplifier zone and the sub decoder zone to select one sub column selecting line from corresponding eight sub column selecting lines in accordance with a signal from the two main column selecting lines and the two sub decoder column selecting lines. The area of the sense amplifier zone can be reduced compared to that of a conventional DRAM in which all signal lines for column selection were provided at a sense amplifier zone.

11 Claims, 14 Drawing Sheets

FIG.5A
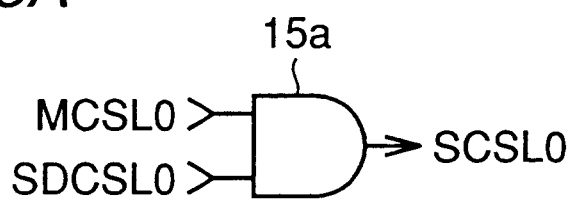
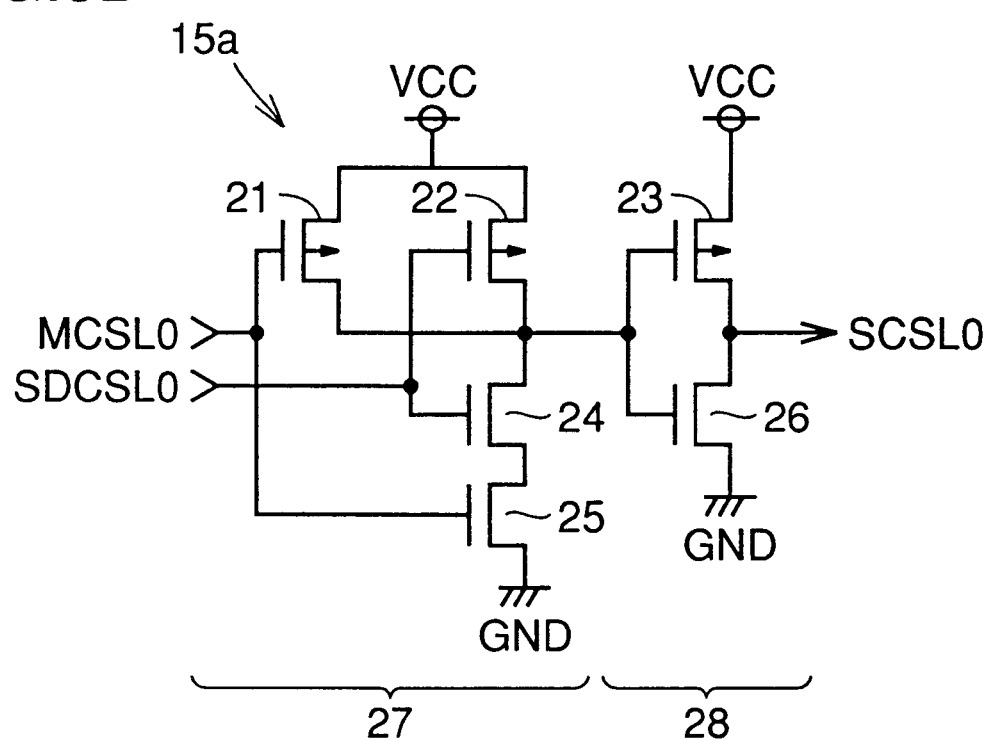
FIG.5B

SEMICONDUCTOR MEMORY DEVICE INCLUDING A PLURALITY OF MEMORY BLOCKS ARRANGED IN ROWS AND COLUMNS

BACKGROUND OF THE INVENTION

1. Field of the Invention

The present invention relates to a semiconductor memory device, and more particularly, to a semiconductor memory device including a plurality of memory blocks arranged in a matrix of rows and columns and enabling simultaneous input/output of a plurality of pieces of data.

2. Description of the Background Art

FIG. 15 is a block diagram showing a configuration of a conventional dynamic random access memory (hereinafter referred to as DRAM) used as a memory to be mounted together with a logic circuit. In FIG. 15, the DRAM includes sixteen memory blocks MB arranged in four rows and four columns. The sixteen memory blocks MB are separated and enclosed by five sense amplifier zones 71 and five sub decoder zones 72.

A main row decoder MRD is provided at one end of each row of memory blocks MB. A number of sub row decoders (not shown) are dispersedly arranged at each sub decoder zone 72. Each sense amplifier zone 71 is provided with eight column selecting lines CSL0 to CSL7 and also with a number of sense amplifiers (not shown) that are dispersedly arranged. One end of each of the eight column selecting lines CSL0 to CSL7 is connected to a column decoder CD. A data input/output line pair group 73 is provided corresponding to each column of memory blocks MB. One end of each data input/output line pair group 73 is connected to a write/read circuit 74.

Four main row decoders MRD and sub decoders select, for example, one memory block MB row and one word line of each memory block MB in the selected row, and activate a plurality of memory cells corresponding to the selected word line. Further, one column selecting line is selected from sixteen column selecting lines CSL0 to CSL7 and CSL0 to CSL 7 arranged at either side of the selected memory block MB row by column decoders CD, and a plurality of memory cells corresponding to the selected column selecting line among the activated plurality of memory cells in each memory block MB are connected to write/read circuit 74 via data input/output line pair group 73. Write/read circuit 74 performs writing/reading of data in each of the activated memory cells via each data input/output line pair group 73. The DRAM enables simultaneous input/output of multiple pieces of data.

However, such a DRAM has a problem in that longer line-routing and larger capacitance value of column selecting lines CSL0 to CSL7 would deaden a waveform of an output signal of column decoder CD, making faster column selecting operation difficult.

FIG. 16 is a block diagram showing a configuration of another conventional DRAM. The DRAM in FIG. 16 is different from the DRAM in FIG. 15 in that eight sub column selecting lines SCSL0 to SCSL7 and a repeater RP are added corresponding to each memory block MB in each sense amplifier zone 71. Repeater RP changes the level of sub column selecting lines SCSL0 to SCSL7 in response to that the level of sub column selecting lines SCSL0 to SCSL7 has exceeded a predetermined threshold potential. A plurality of memory cells, corresponding to the sub column selecting lines that are set to be at a selected level, of a plurality of activated memory cells in each memory block MB are connected to write/read circuit 74 via a data input/output line pair group (not shown). In this DRAM, a waveform of an output signal of column decoder CD can be regenerated by repeater RP, so that faster column selecting operation is enabled.

However, the DRAM in FIG. 16 has a problem in that eight sub column selecting lines SCSL0 to SCSL7 must be arranged in parallel with eight column selecting lines CSL0 to CSL7 in each sense amplifier zone 71, increasing the area of sense amplifier zone 71.

SUMMARY OF THE INVENTION

Therefore, a main object of the present invention is to provide a semiconductor memory device having a small area of a first zonal region and a fast operation speed.

In a semiconductor memory device according to the present invention, a column selecting circuit includes a plurality of first signal transmission lines provided corresponding to each memory block row and arranged to extend along the length of a first zonal region adjacent to a corresponding memory block row; a plurality of second signal transmission lines provided corresponding to each memory block column and arranged to extend along the length of a second zonal region adjacent to a corresponding memory block column; a first decoder provided corresponding to each memory block row and generating a first predecode signal based on a column address signal to apply the first predecode signal to a plurality of corresponding first signal transmission lines; a second decoder provided corresponding to each memory block column and generating a second predecode signal based on the column address signal to apply the second predecode signal to a plurality of corresponding second signal transmission lines; and a third decoder provided corresponding to each memory block and arranged at a crossing portion of the first and second zonal regions adjacent to a corresponding memory block, and selecting one bit line pair from a plurality of bit line pairs of the corresponding memory block based on the first predecode signal from the plurality of corresponding first signal transmission lines and the second predecode signal from the plurality of corresponding second signal transmission lines. Therefore, the area of the first zonal region may be smaller compared to that of a conventional memory device in which a plurality of signal transmission lines for column selection were provided only in the first zonal region. Further, the third decoder provided at the crossing portion of the first and second zonal regions selects a bit line pair of a memory block in the vicinity of the third decoder, so that the speed of the column selecting operation can be increased.

Preferably, the first predecode signal includes a plurality of first signals respectively applied to the plurality of first signal transmission lines, and the second predecode signal includes a plurality of second signals respectively applied to the plurality of second signal transmission lines. One first signal of the plurality of first signals is set to be at an activated level by the first decoder and one signal of the plurality of second signals is set to be at the activated level. This can make the number of the signal transmission lines smaller.

More preferably, the third decoder includes a plurality of logic circuits respectively provided corresponding to the plurality of column selecting lines and arranged at a plurality of crossing portions of the plurality of first signal transmission lines and the plurality of second signal transmission lines, each of the plurality of logic circuits setting a corresponding column selecting line to be at a selected level in response to that a first signal from a corresponding first signal transmission line and a second signal from a corresponding second signal transmission line are both set to be at the activated level. When the column selecting line is set to be at a selected level, a column selection gate between a bit line pair and a write/read circuit corresponding to the column selecting line is made conductive. This facilitates configuration of the third decoder.

More preferably, the plurality of first signal transmission lines are paired up to constitute a plurality of first signal transmission line pairs; the plurality of second signal transmission lines are paired up to constitute a plurality of second signal transmission line pairs; the first predecode signal includes a plurality of sets of first signals and complementary signals of the first signals respectively applied to the plurality of first signal transmission lines; and the second predecode signal includes a plurality of sets of second signals and complementary signals of the second signals respectively applied to the plurality of second signal transmission lines. One set of a first signal and its complementary signal of the plurality of sets of first signals and their complementary signals are respectively set to be at the first and second selected levels by the first decoder, whereas one set of a second signal and its complementary signal of the plurality sets of the second signals and their complementary signals are respectively set to be at the first and second logic levels by the second decoder. This can reduce the adverse effects of noise.

More preferably, the third decoder includes a plurality of logic circuits respectively provided corresponding to the plurality of column selecting lines and arranged at a plurality of crossing portions of the plurality of first signal transmission line pairs and the plurality of second signal transmission line pairs, each of the plurality of logic circuits setting a corresponding column selecting line to be at a selected level in response to that a first signal and a complementary signal of the first signal from a corresponding first signal transmission line pair are set to be at a first logic level and a second logic level respectively and that a second signal and a complementary signal of the second signal from a corresponding second signal transmission line pair are set to be at the first logic level and the second logic level respectively. When the column selecting line is set to be at the selected level, a column selection gate between a bit line pair and a write/read circuit that are corresponding to the column selecting line is made conductive. This facilitates the configuration of the third decoder.

More preferably, the plurality of second signal transmission lines are separately arranged at second zonal regions on either side of a corresponding memory block column; a plurality of second signal transmission lines arranged at one of the second zonal regions are provided in common to memory block columns at either side of the second zonal region; the third decoder is divided and arranged at a plurality of crossing portions of first zonal regions and second zonal regions adjacent to a corresponding memory block; and a portion of the third decoder arranged at one crossing portion is shared by memory block columns on either side of a second zonal region including the crossing portion. This can make the number of the second signal transmission lines smaller.

More preferably, the plurality of second signal transmission lines are arranged at a second zonal region at one side of a corresponding memory block column. This allows each memory block to select a bit line pair independently from the other memory blocks.

More preferably, the second decoder is inactivated in response to that a write mask signal for inhibiting writing of data into each memory cell in a corresponding memory block column is applied. This can realize a write mask operation.

More preferably, the column selecting circuit includes a word line driving circuit provided corresponding to each word line of each memory block and arranged at a second zonal region adjacent to a corresponding memory block, and setting a corresponding word line to be at a selected level, in response to that the corresponding word line is selected, and the second decoder further inactivates each corresponding word line driving circuit in response to that the write mask signal is applied. This can lower consumption electric power.

More preferably, a plurality of word lines in each memory block are divided into a plurality of groups respectively including N (N is an integer equal to or greater than 2) word lines; the column selecting circuit further includes a fourth decoder provided corresponding to each of the memory block rows to select one group from a plurality of groups of each corresponding memory block in accordance with the row address signal, and a fifth decoder provided corresponding to each memory block to select one word line from N word lines in each corresponding group in accordance with the row address signal; the word line driving circuit is activated in response to that a corresponding group is selected by the forth decoder, and sets a corresponding word line to be at a selected level in response to that the corresponding word line is selected by the fifth decoder; and the second decoder inactivates each corresponding fifth decoder in response to that the write mask signal is applied. This can realize a configuration of divided world lines, so that a column selecting operation can be made faster.

More preferably, the row selecting circuit further includes a plurality of main word lines provided corresponding to each memory block row and arranged to cross a plurality of corresponding memory blocks, and respectively provided corresponding to a plurality of groups of each corresponding memory block, and N third signal transmission lines provided corresponding to each memory block and arranged at a second zonal region adjacent to a corresponding memory block, and respectively provided corresponding to N word lines of each corresponding group. The fourth decoder sets a main word line corresponding to a selected group to be at an activated level, and the fifth decoder sets a third signal transmission line corresponding to a selected word line to be at a selected level. The word line driving circuit is activated in response to that a corresponding main word line is set to be at the activated level, and sets a corresponding word line to be at a selected level in response to that a corresponding third signal transmission line is set to be at the selected level. This facilitates arrangement of the main word lines and the third signal transmission lines for column selection.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5A and 5B are circuit diagrams showing a configuration of an AND gate shown in FIG. 4;

DESCRIPTION OF THE PREFERRED EMBODIMENTS

First Embodiment

Figure 1:
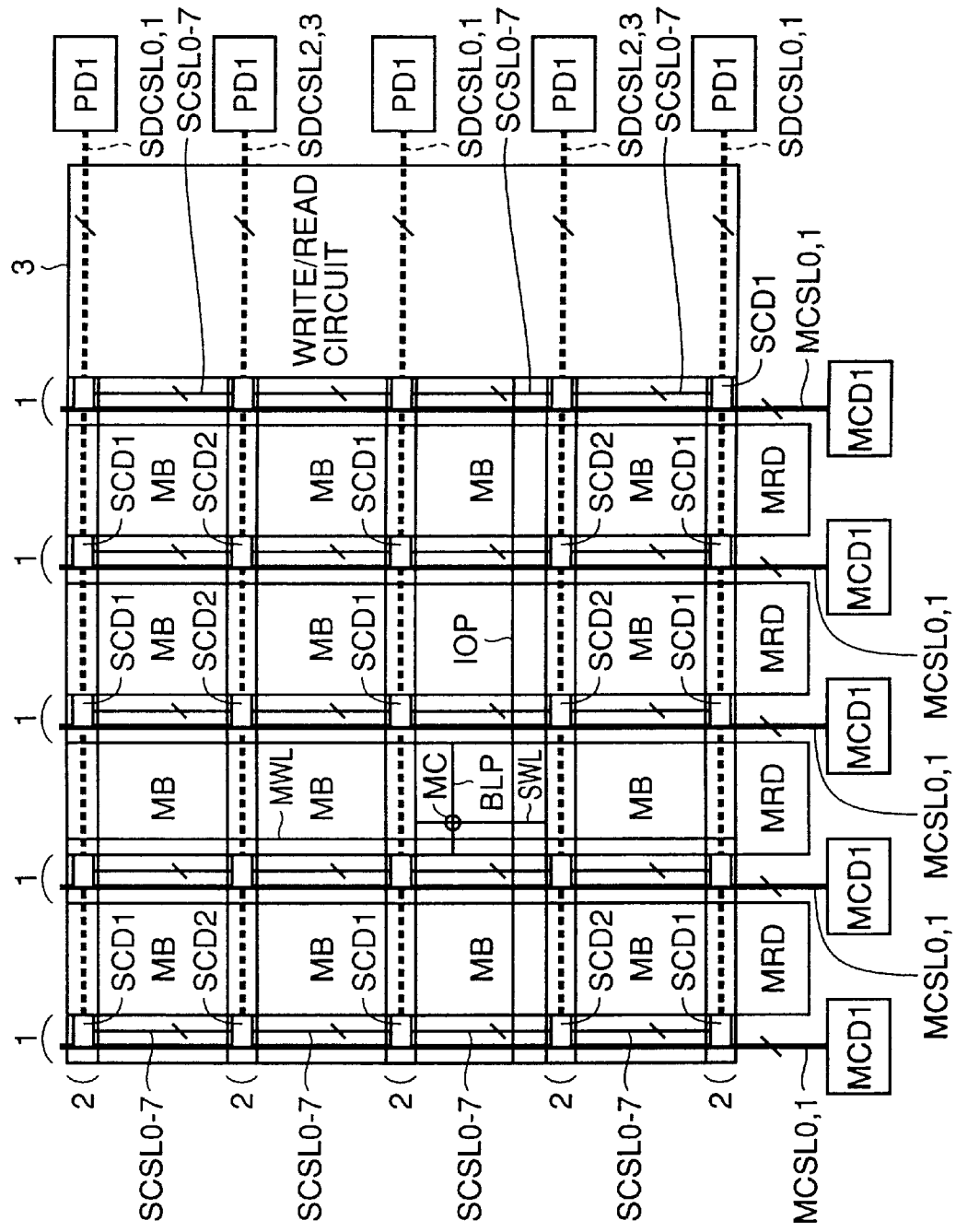
FIG. 1 is a block diagram showing a configuration of a DRAM according to the first embodiment of the present invention.
Figure 2:
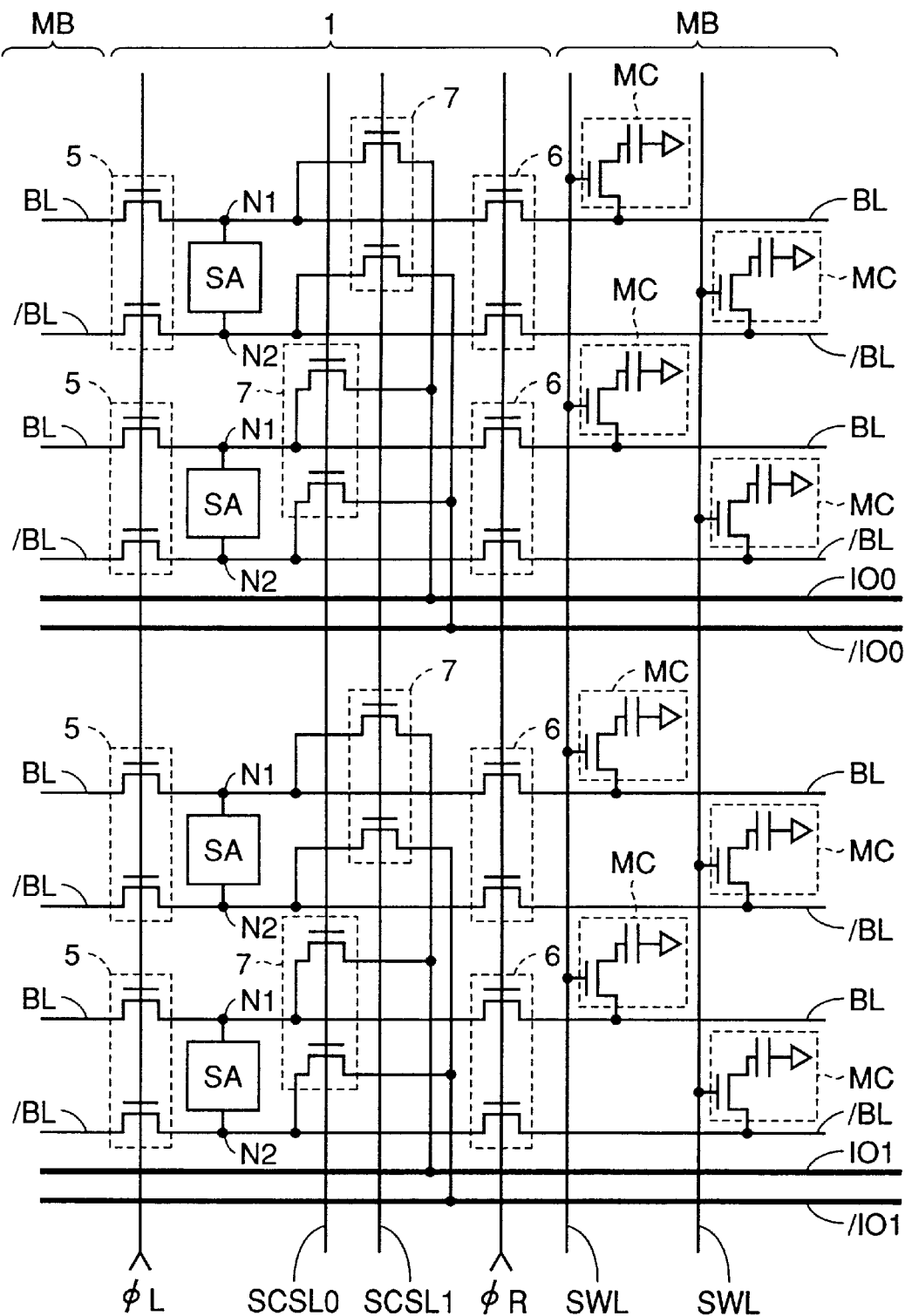
FIG. 2 is a circuit block diagram showing memory blocks and a sense amplifier zone shown in FIG. 1.

FIG. 1 is a block diagram showing a configuration of a DRAM mounted together with a logic circuit, according to the first embodiment. In FIG. 1, the DRAM includes sixteen memory blocks MB arranged in four rows and four columns. Each memory block MB includes, as shown in FIG. 2, a plurality of memory cells MC arranged in a plurality of rows and a plurality of columns (only two rows and four columns are shown in the drawing), a sub word line SWL provided corresponding to each row, and a bit line pair BL, /BL (BLP) provided corresponding to each column. A memory cell MC is a well-known memory cell including an N-channel MOS transistor for accessing and a capacitor for storing information.

The sixteen memory blocks MB are separated lengthwise and crosswise and also surrounded by five sense amplifier zones 1 and five sub decoder zones 2. The five sub decoder zones 2 are dispersed with a plurality of sub row decoders (not shown). A plurality of main word lines MWL and a main row decoder MRD connected to one terminal of each of the main word lines MWL are provided respectively corresponding to memory blocks MB rows. Each main word line MWL extends to cross four memory blocks MB in a corresponding row. A plurality of sub word lines SWL for each memory block MB are pre-divided into a plurality of groups each including a plurality of sub word lines SWL. A sub row decoder and a main word line MWL are provided corresponding to each of the groups.

Main row decoder MRD selects one main word line MWL from the plurality of main word lines MWL in accordance with a row address signal, and sets the selected main word line MWL to be at the logic high or an "H" level to activate a corresponding sub row decoder. The activated sub row decoder selects one sub word line SWL from the plurality of sub word lines SWL included in a corresponding group in accordance with the row address signal, and sets the selected sub word line SWL to be at the "H" level, i.e. the selected level, to activate each corresponding memory cell MC.

Five sense amplifier zones 1 are dispersed with a plurality of sense amplifiers SA. Two memory blocks MB and MB share a sense amplifier SA between the two memory blocks MB and MB. Each sense amplifier SA amplifies a small potential difference generated between a corresponding bit line pair BL, /BL to a power-supply voltage VCC.

Each sense amplifier zone 1 is provided with four sets of sub column selecting lines SCSL0 to SCSL7. Two memory blocks MB and MB share sub column selecting lines SCSL0 to SCSL7 between the two memory blocks MB and MB. A plurality of bit line pairs BL, /BL in each memory block MB are pre-divided into sixteen groups each including a plurality of bit line pairs BL, /BL. A plurality of data input/output line pairs IO, /IO (IOP) are arranged corresponding to each column of memory blocks MB. Each data input/output line pair IO, /IO extends to cross four memory blocks MB in a corresponding column. One end of each data input/output line pair IO, /IO is connected to a write/read circuit 3.

When one sub column selecting line of sixteen sub column selecting lines SCSL0 to SCSL7 and SCSL0 to SCSL7 on either side of memory block MB is set to be at the selected level of the "H" level, each bit line pair BL, /BL in the group corresponding to the selected sub column selecting line is connected to write/read circuit 3 via a corresponding data input/output line pair IO, /IO. Write/read circuit 3 writes/reads data in the selected memory cell MC via each data input/output line pair IO, /IO.

More specifically, sense amplifier zone 1 includes, as shown in FIG. 2, a sense amplifier SA, transfer gates 5 and 6, and a column selection gate 7 that are provided corresponding to each memory cell column. FIG. 2 shows sense amplifier zone 1 between two memory blocks MB and MB, in which only two sub column selecting lines SCSL0 and SCSL1 and only two data input/output line pairs IO0, /IO0 and IO1, /IO1 are shown for simplifying the drawing.

Figure 3:
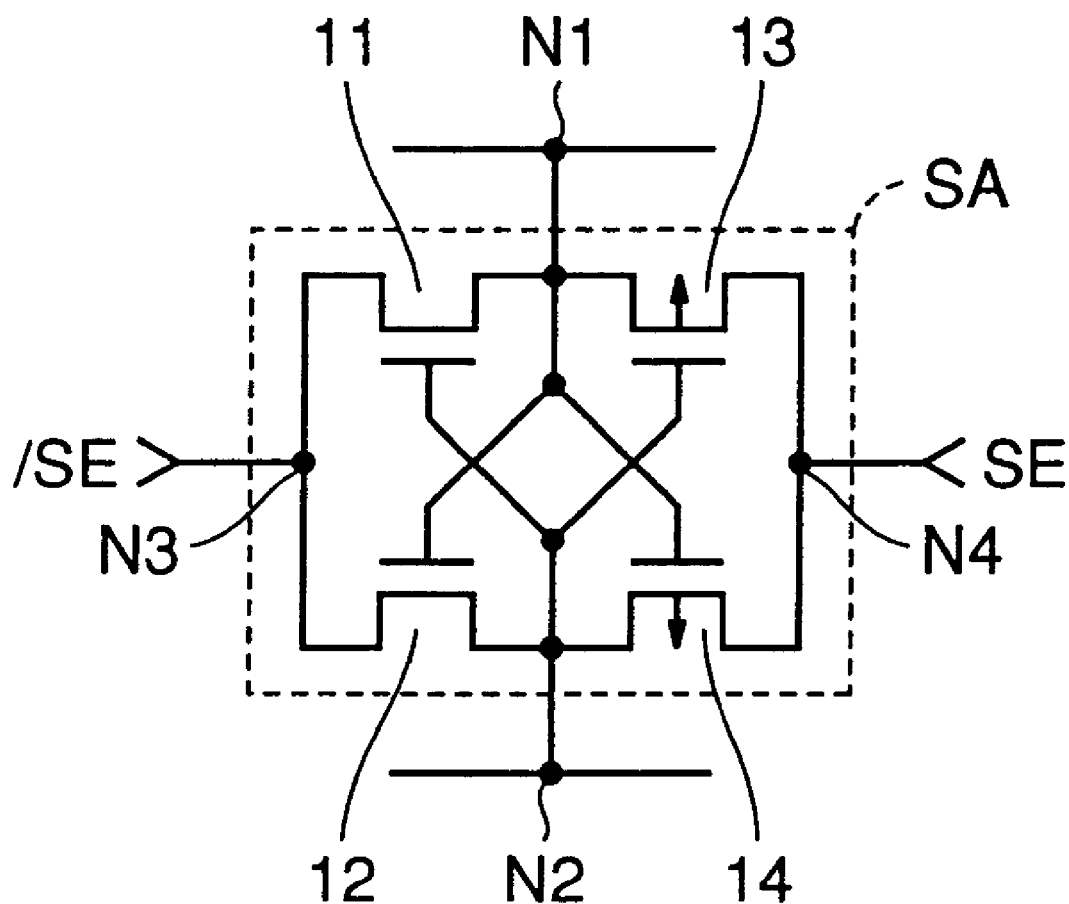
FIG. 3 is a circuit diagram showing a configuration of a sense amplifier shown in FIG. 2.

Referring to FIG. 3, sense amplifier SA includes N-channel MOS transistors 11, 12 and P-channel MOS transistors 13, 14. N-channel MOS transistors 11, 12 are respectively connected between nodes N1, N2 and a node N3, and the gates thereof are respectively connected to nodes N2 and N1. P-channel MOS transistors 13, 14 are respectively connected between nodes N1, N2 and a node N4, and the gates thereof are respectively connected to nodes N2 and N1. Nodes N3 and N4 respectively receive sense amplifier activation signals /SE, SE.

When sense amplifier activation signals /SE, SE are respectively set to be at a logic low or an "L" level and the "H" level, sense amplifier SA is activated. If the potential of node N1 is higher than that of node N2, the resistance value of MOS transistors 12 and 13 will be lower than the resistance values of MOS transistors 11 and 14, setting nodes N1 and N2 to be at the "H" level (power-supply potential VCC) and the "L" level (ground potential GND) respectively. If the potential of node N1 is lower than the potential of node N2, the resistance value of MOS transistors 11 and 14 will be smaller than the resistance value of MOS transistors 12 and 13, setting nodes N1 and N2 to be at the "L" level and the "H" level, respectively.

Referring again to FIG. 2, each of gates 5 to 7 includes two N-channel MOS transistors. The two N-channel MOS transistors in transfer gate 5 are respectively connected between corresponding bit lines BL, /BL and nodes N1, N2 of a corresponding sense amplifier SA that are included in one memory block MB, and the gates of the transistors both receive a signal φL. The two N-channel MOS transistors in transfer gate 6 are respectively connected between corresponding bit lines BL, /BL and nodes N1, N2 of sense amplifier SA that are included in the other memory block MB, and the gates of the transistors both receive a signal φR. During reading/writing operation, one of the signals φL and φR (e.g. φL) is set to be at the "L" level rendering transfer gate 5 non-conductive, and each sense amplifier SA is connected to bit line pair BL, /BL of memory block MB on the right hand in the drawing via transfer gate 6.

Nodes N1, N2 of sense amplifier SA in the first column in the drawing are respectively connected to data input/output lines IO0, /IO0 via two N-channel MOS transistors included in column selection gate 7. Nodes N1, N2 of sense amplifier SA in the second column are respectively connected to data input/output lines IO0, /IO0 via two N-channel MOS transistors included in column selection gate 7. Nodes N1, N2 of sense amplifier SA in the third column are respectively connected to data input/output lines IO1, /IO1 via two N-channel MOS transistors included in column selection gate 7. Nodes N1, N2 of sense amplifier SA in the fourth column are respectively connected to data input/output lines IO1, /IO1 via two N-channel MOS transistors included in column selection gate 7. The gate of each of the N-channel MOS transistors in column selection gates 7 in the second column and the fourth column are connected to sub column selecting line SCSL0. The gate of each of the N-channel MOS transistors in column selection gates 7 in the first and third columns is connected to sub column selecting line SCSL1.

When sub column selecting line SCSL0 is set to be at the "H" level, i.e. the selected level, column selection gates 7, 7 in the second column and the fourth column are rendered conductive, and nodes N1, N2 in the second column and nodes N1, N2 in the fourth column are respectively connected to data input/output line pairs IO0, /IO0 and IO1, /IO1 via corresponding column selection gates 7, 7. When sub column selecting line SCSL1 is set to be at the selected level of the "H" level, column selection gates 7, 7 in the first column and the third column are rendered conductive, and nodes N1, N2 in the first column and nodes N1, N2 in the third column are respectively connected to data input/output line pairs IO0, /IO0 and IO1, /IO1 via column selection gates 7, 7.

Referring again to FIG. 1, two main column selecting lines MCSL0, MCSL1 and a main column decoder MCD1 are provided corresponding to each sense amplifier zone 1. Main column selecting lines MCSL0, MCSL1 extend along the length of a corresponding sense amplifier zone 1, and one end thereof is connected to a corresponding main column decoder MCD1. Main column decoder MCD1 selects one main column selecting line from the two main column selecting lines MCSL0 and MCSL1 in accordance with a column address signal, and sets the selected main column selecting line to be at the selected level of the "H" level. Two rows of memory blocks MB share main column selecting lines MCSL0 and MCSL1 between the two rows of memory blocks MB.

Two sub decoder column selecting lines SDCSL0, SDCSL1 and a predecoder PD1 are provided corresponding to each sub decoder zone 2 in the first, third and fifth columns from the bottom, of five sub decoder zones 2. Sub decoder column selecting lines SDCSL0, SDCSL1 extend along the length of a corresponding sub decoder zone 2, and one end of each of the lines is connected to a corresponding predecoder PD1. Two sub decoder column selecting lines SDCSL2, SDCSL3 and a predecoder PD1 are provided corresponding to each sub decoder zone 2 in the second and fourth columns of five sub decoder zones 2. Sub decoder column selecting lines SDCSL2, SDCSL3 extend along the length of a corresponding sub decoder zone 2, and one end of each of the lines is connected to predecoder PD1. Five predecoders PD1 select one kind of sub decoder column selecting line from four kinds of sub decoder column selecting lines SDCSL0 to SDCSL3 in accordance with a column address signal, and sets the selected kind of sub decoder column selecting lines (for example, three column selecting lines SDCSL0) to the selected level of the "H" level.

A sub column decoder SCD1 is provided at each crossing portion of sub decoder column selecting lines SDCSL0, SDCSL1 and five sets of main column selecting lines MCSL0, MCSL1, whereas a sub column decoder SCD2 is provided at each crossing portion of sub decoder column selecting lines SDCSL2, SDCSL3 and five sets of main column selecting lines MCSL0, MCSL1.

Figure 4:
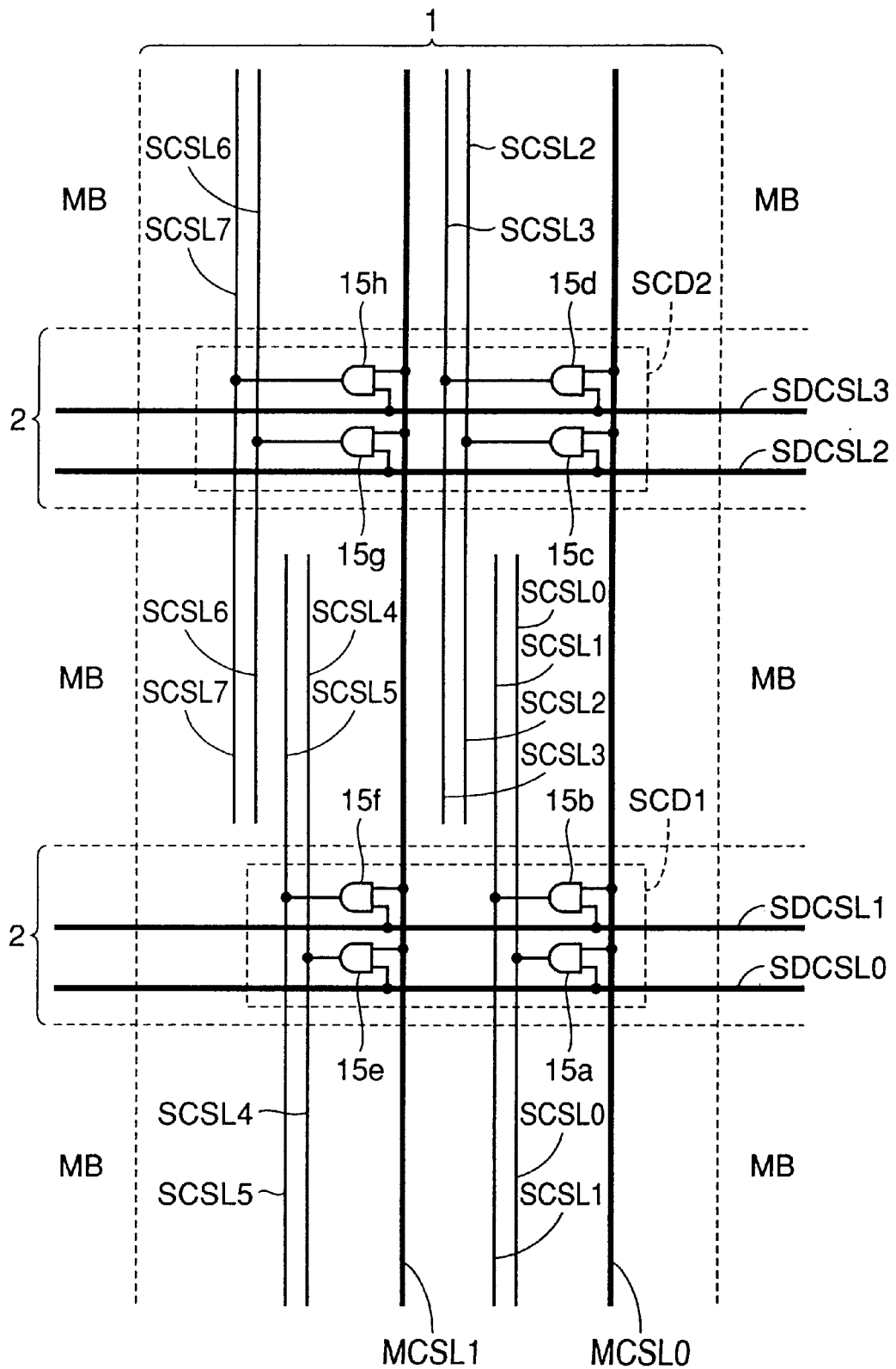
FIG. 4 is a circuit diagram showing a configuration of a sub column decoder shown in FIG. 1.

FIG. 4 is a circuit diagram showing a configuration of sub column decoders SCD1 and SCD2. In FIG. 4, sub column decoder SCD1 includes AND gates 15a, 15b, 15e and 15f, whereas sub column decoder SCD2 includes AND gates 15c, 15d, 15g and 15h. One input node of each of AND gates 15a to 15d is connected to a main column selecting line MCSL0, and the other input nodes thereof are respectively connected to sub decoder column selecting lines SDCSL0 to SDCSL3. One input node of each of AND gates 15e to 15h is connected to a main column selecting line MCSL1, and the other input nodes thereof are respectively connected to sub decoder column selecting lines SDCSL4 to SDCSL7, and the output nodes thereof are respectively connected to sub column selecting lines SCSL4 to SCSL7.

Sub column decoder SCD1 is provided in common to sub column selecting lines SCSL0, SCSL1, SCSL4 and SCSL5 corresponding to the memory block MB at the center of FIG. 4, and to sub column selecting lines SCSL0, SCSL1, SCSL4 and SCSL5 corresponding to the memory block MB at the lower side. Sub column decoder SCD2 is provided in common to sub column selecting lines SCSL2, SCSL3, SCSL6 and SCSL7 corresponding to the memory block MB at the center, and to sub column selecting lines SCSL2, SCSL3, SCSL6 and SCSL7 corresponding to the memory block MB at the upper side.

When one main column selecting line (e.g. MCSL0) of the two main column selecting lines MCSL0, MCSL1 is set to be at the selected level of the "H" level, and one sub decoder column selecting line (e.g. SDCSL0) of the four sub decoder column selecting lines SDCSL0 to SDCSL3 is set to be at the selected level of the "H" level, AND gate 15a outputs the "H" level, setting sub column selecting line SCSL0 to be at the "H" level, i.e. the selected level.

FIGS. 5A and 5B are circuit diagrams showing a configuration of AND gate 15a. In FIGS. 5A and 5B, AND gate 15a includes P-channel MOS transistors 21 to 23 and N-channel MOS transistors 24 to 26. MOS transistors 21, 22, 24 and 25 constitute an NAND gate 27, and MOS transistors 23 and 26 constitute an inverter.

When both main column selecting line MCSL0 and sub decoder column selecting line SDCSL0 are at the selected level of the "H" level, P-channel MOS transistors 21 and 22 will be non-conductive, whereas N-channel MOS transistors 24 and 25 will be conductive, and thus NAND gate 27 outputs the "L" level. This renders P-channel MOS transistor 23 conductive while rendering N-channel MOS transistor 26 non-conductive, and an inverter 28 sets sub column selecting line SCSL0 to be at the "H" level.

When at least one of main column selecting line MCSL0 and sub decoder column selecting line SDCSL0 is at the "L" level, i.e. a non-selected level, at least one of P-channel MOS transistors 21 and 22 will be conductive whereas at least one of N-channel MOS transistors 24 and 25 will be non-conductive, and thus NAND gate 27 outputs the "H" level. This renders P-channel MOS transistor 23 non-conductive while rendering N-channel MOS transistor 26 conductive, and inverter 28 sets sub column selecting line SCSL0 to be at the "L" level. The other AND gates 15b to 25h have the same configurations as that of AND gate 15a.

The operation of the DRAM is now described. In reading operation, main row decoder MRD and sub row decoders select one memory block MB row from the four memory block MB rows and one sub word line SWL in each memory block MB included in the selected memory block MB row, to set the selected sub word line SWL to be at the selected level of the "H" level. It is assumed that, in FIG. 2, the memory block MB on the right side is selected from two memory blocks MB, MB, and one sub word line SWL of the selected memory block MB is set to be at the selected level of the "H" level. Accordingly, signal φL of the signals φL and φR is set to be at the "L" level, rendering each transfer gate 5 non-conductive and the connection between memory block MB and sense amplifier SA on the left side is cut off. When sub word line SWL is set to be at the selected level of the "H" level, each memory cell MC corresponding to the sub word line SWL is activated, generating a small potential difference, in accordance with memory data in a corresponding memory cell MC, between each bit line pair BL and /BL that are pre-charged to a bit line potential VCC/2.

Subsequently, each sense amplifier SA is activated to amplify the small potential difference between each bit line pair BL and /BL to power-supply voltage VCC. Thereafter, one sub column selecting line of sixteen sub column selecting lines SCSL0 to SCSL7 and SCSL0 to SCSL7 corresponding to each selected memory block MB is set to be at the selected level of the "H" level by main column decoder MCD, predecoder PD and sub column decoders SCD1, SCD2. In FIG. 2, it is assumed that sub column selecting line SCSL0 of two sub column selecting lines SCSL0, SCSL1 is set to be at the selected level of the "H" level. This renders column selection gates 7, 7 in the second column and the fourth column conductive, and sense amplifiers SA, SA in the second column and the fourth column are respectively connected to data input/output line pairs IO0, /IO0 and IO1, /IO1. Write/read circuit 3 outputs logical data, in accordance with each potential difference between data input/output lines IO0 and /IO0, and between IO1 and /IO1, to the outside as read data. Sub word line SWL and sub column selecting line SCSL0 are set to be at the non-selected level of the "L" level, inactivating sense amplifier SA, and signal φL is set to be at the "H" level, and thus the DRAM returns to a stand-by state.

In writing operation, write/read circuit 3 writes data into each activated memory cell MC by setting one data input/output line of each of data input/output line pairs IO0, /IO0 and IO1, /IO1 to the "H" level while setting the other data input/output lines to the "L" level. The other operation processes are similar to that of the reading operation.

Figure 16:
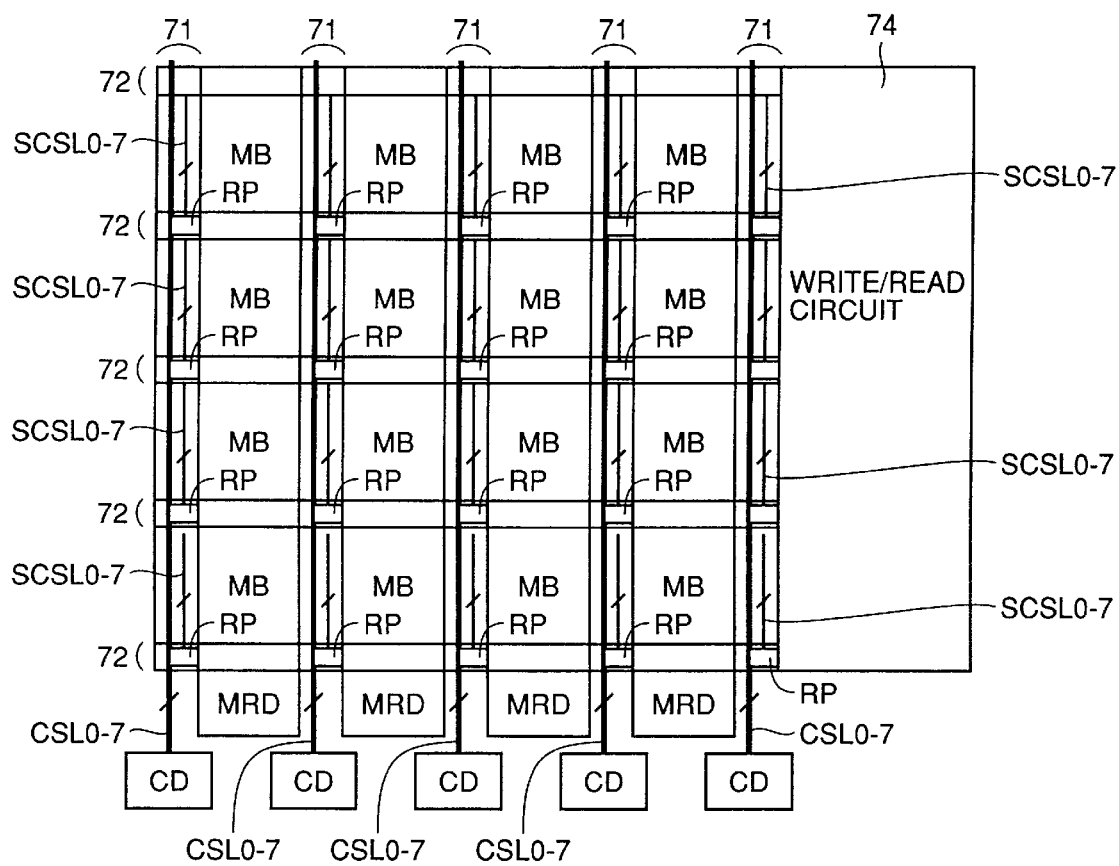
FIG. 16 is a block diagram showing a configuration of another conventional DRAM.

In the first embodiment, provision of only two main column selecting lines MCSL0, MCSL1 and eight sub column selecting lines SCSL0 to SCSL7 corresponding to each memory block MB in each sense amplifier zone 1 may be sufficient, so that the area of sense amplifier zone 1 can be reduced compared to that in the DRAM shown in FIG. 16 in which eight column selecting lines CSL0 to SCSL7 and eight sub column selecting lines SCSL0 to SCSL7 were required.

Figure 15:
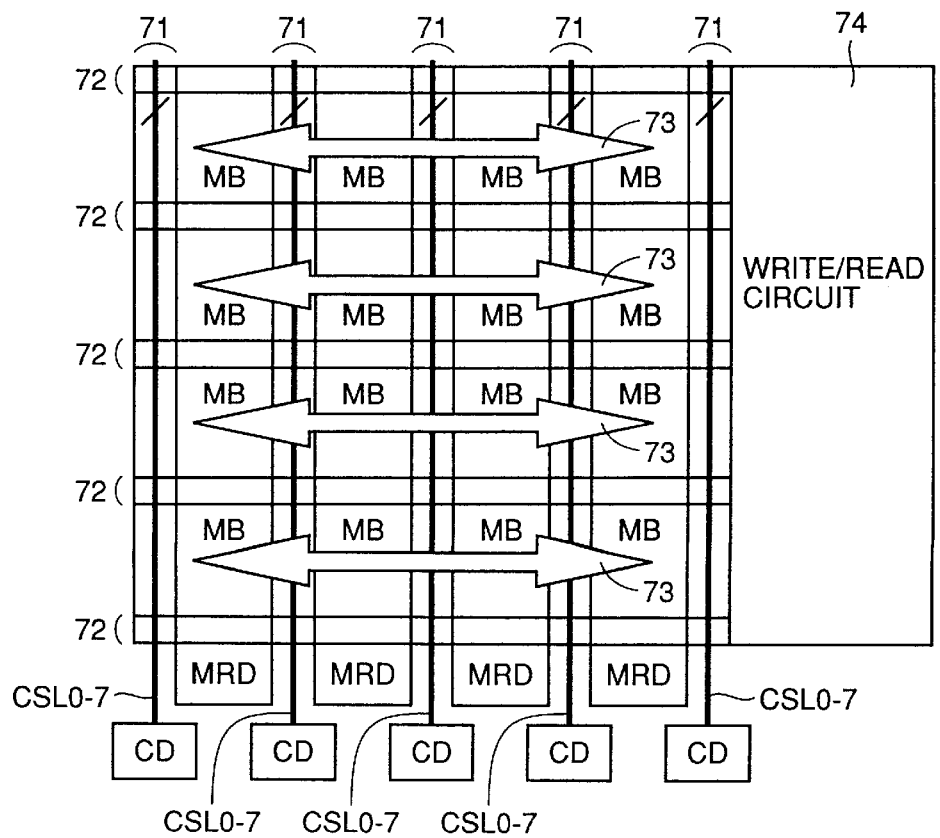
FIG. 15 is a block diagram showing a configuration of a conventional DRAM.

Further, AND gates 15a to 15h of sub column decoders SCD1, SCD2 regenerate the waveform of output signals of decoders MCD1 and PD1, so that the column selecting operation can be faster compared to that of the DRAM shown in FIG. 15.

Second Embodiment

Figure 6:
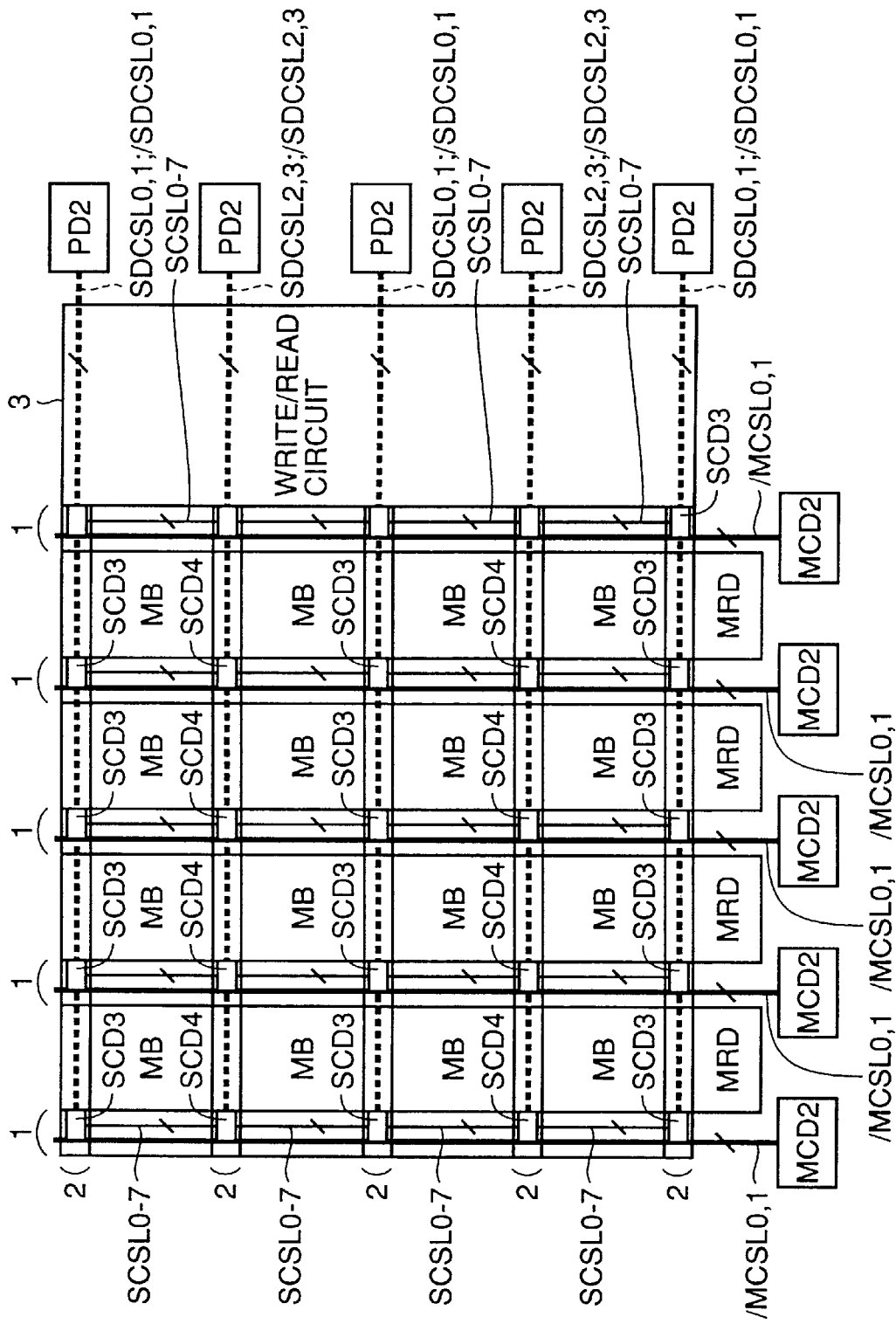
FIG. 6 is a block diagram showing a configuration of a DRAM according to the second embodiment of the present invention.

FIG. 6 is a block diagram showing a configuration of a DRAM according to the second embodiment of the present invention. Referring to FIG. 6, this DRAM is different from the DRAM shown in FIG. 1 in that main column decoder MCD1 and main column selecting lines MCSL0, MCSL1 are replaced by main column decoder MCD2 and main column selecting lines /MCSL0, /MCSL1, and that predecoder PD1 and sub decoder column selecting lines SDCSL0 to SDCSL3 are replaced by predecoder PD2 and sub decoder column selecting line pairs SDCSL0, /SDCSL0; . . . ; and SDCSL3, /SDCSL3, and that sub column decoders SCD1, SCD2 are replaced by sub column decoders SCD3, SCD4.

Main column decoder MCD2 selects one main column selecting line from main column selecting lines /MCSL0 and /MCSL1 in accordance with a row address signal to set the selected main column selecting line to be at the selected level of the "L" level. Predecoder PD2 selects one sub decoder column selecting line pair (e.g. SDCSL0, /SDCSL0) from the four kinds of sub decoder column selecting line pairs SDCSL0, /SDCSL0; . . . ; and SDCSL3, /SDCSL3, to set the selected sub decoder column selecting line pair (SDCSL0, /SDCSL0 in this case) to the "H" level and the "L" level, respectively.

Figure 7:
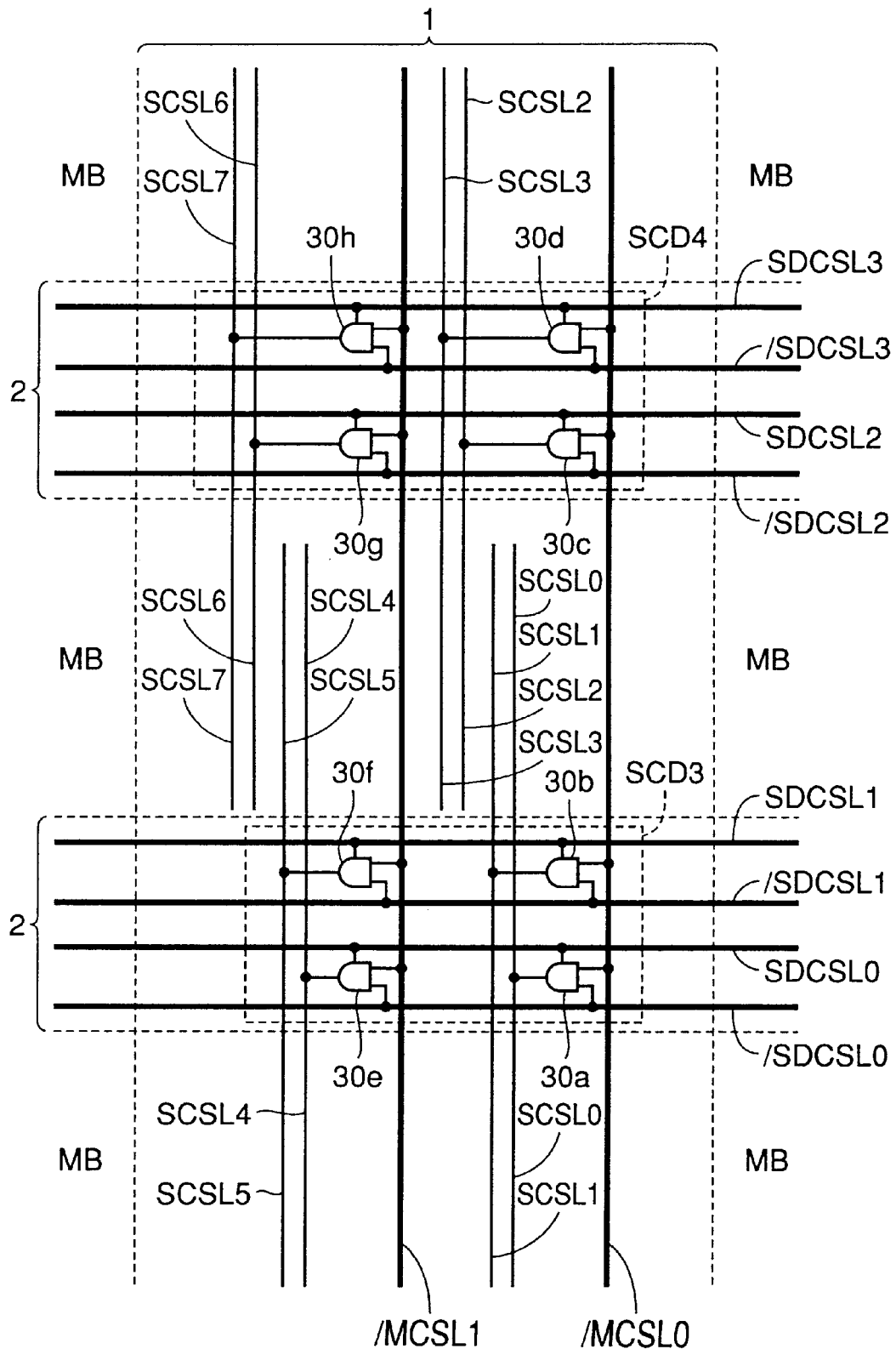
FIG. 7 is a circuit diagram showing a configuration of a sub column decoder shown in FIG. 6.

FIG. 7 is a circuit diagram showing configurations of sub column decoders SCD3 and SCD4. In FIG. 7, sub column decoder SCD3 includes source follower circuits 30a, 30b, 30e and 30f, and sub column decoder SCD4 includes source follower circuits 30c, 30d, 30g and 30h. Input nodes of source follower circuits 30a to 30d are all connected to main column selecting line /MCSL0, control nodes thereof are respectively connected to sub decoder column selecting lines SDCSL0 to SDCSL3, inversion control nodes thereof are respectively connected to sub decoder column selecting lines /SDCSL0 to /SDCSL3, and output nodes thereof are respectively connected to sub column selecting lines SCSL0 to SCSL3. Input nodes of source follower circuits 30e to 30h are all connected to main column selecting line /MCSL1, control nodes thereof are respectively connected to sub decoder column selecting lines SDCSL0 to SDCSL3, inversion control nodes thereof are respectively connected to sub decoder column selecting lines /SDCSL0 to /SDCSL3, and output nodes thereof are respectively connected to sub column selecting lines SCSL4 to SCSL7.

When one main column selecting line (e.g. /MCSL0) of the two main column selecting lines /MCSL0, /MCSL1 is set to be at the selected level of "L", and one sub decoder column selecting line pair (e.g. SDCSL0, /SDCSL0) of the four sub decoder column selecting line pairs SDCSL0, /SDCSL0; . . . ; and SDCSL3, /SDCSL3 are respectively set to be at the "H" level and the "L" level, source follower circuit 30a outputs the "H" level, and sub column selecting line SCSL0 is set to be at the selected level of the "H" level.

Figure 8A:
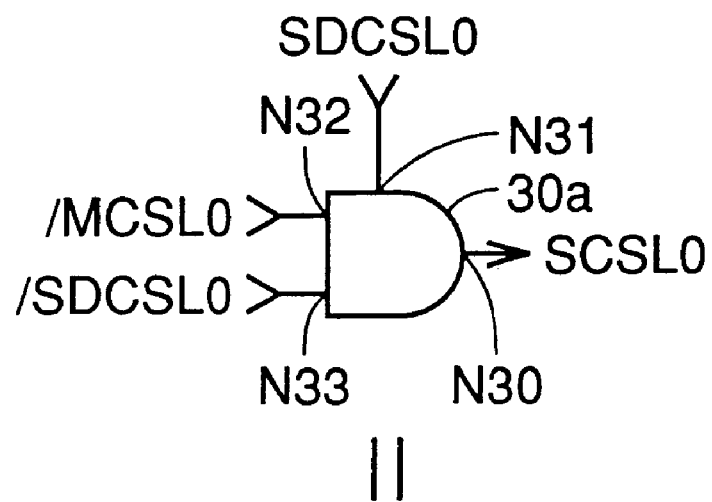
FIGS. 8A and 8B are circuit diagrams showing a configuration of a source follower circuit shown in FIG. 7.
Figure 8B:
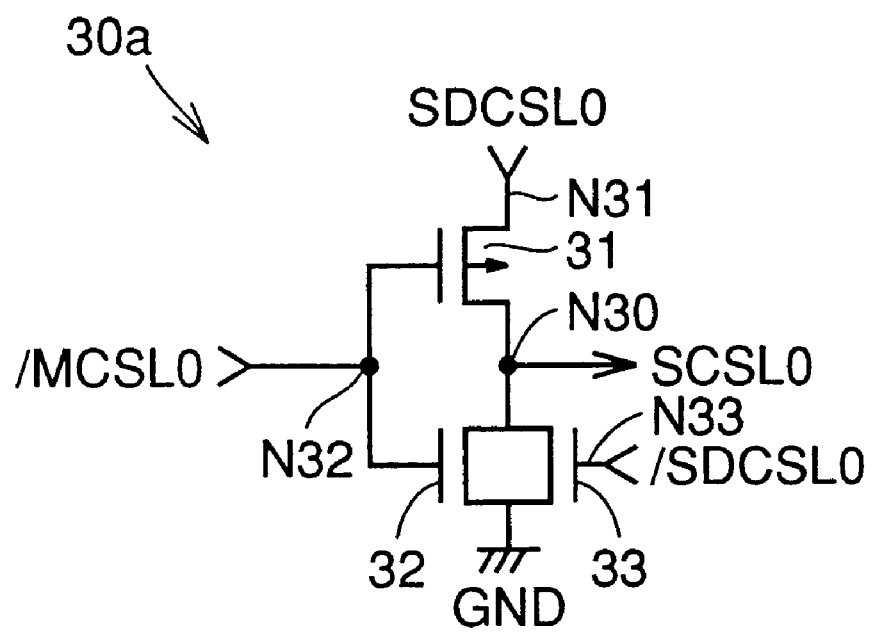

FIGS. 8A and 8B are circuit diagrams showing a configuration of source follower circuit 30a. In FIGS. 8A and 8B, source follower circuit 30a includes a P-channel MOS transistor 31 and N-channel MOS transistors 32, 33. P-channel MOS transistor 31 is connected between a control node N31 (sub decoder column selecting line SDCSL0) and an output node N30 (sub column selecting line SCSL0), and the gate thereof is connected to an input node N32 (main column selecting line /MCSL0). N-channel MOS transistor 32 is connected between output node N30 and the line of a ground potential GND, and the gate thereof is connected to input node N32. N-channel MOS transistor 33 is connected between output node N30 and the line of ground potential GND, and the gate thereof is connected to an inversion control node N33 (sub decoder column selecting line /SDCSL0).

When control node N31 and inversion control node N33 are respectively set to be at the "H" level and the "L" level and input node N32 is set to be at the "L" level, P-channel MOS transistor 31 is rendered conductive whereas N-channel MOS transistors 32, 33 are rendered non-conductive, setting output node N30 to be at the "H" level. When at least one of input node N32 and inversion control node N33 is at the "H" level, P-channel MOS transistor 31 is rendered non-conductive whereas at least one of N-channel MOS transistors 32 and 33 is rendered conductive, setting output node N30 to be at the "L" level. The other configurations and operations are similar to that of the first embodiment, so that the description thereof will not be repeated.

In the second embodiment, in addition to attainment of the same effect as that of the first embodiment, the adverse effect of noise can be reduced because an output signal of predecoder PD2 is transmitted using complementary signal transmission line pairs SDCSL0, /SDCSL0; . . . ; and SDCSL3, /SDCSL3.

Further, sub column decoders SCD3, SCD4 are constituted by source follower circuits 30a to 30h, so that the number of transistors can be reduced compared to the first embodiment where sub column decoders SCD1, SCD2 were constituted by AND gates 15a to 15h.

Third Embodiment

Figure 9:
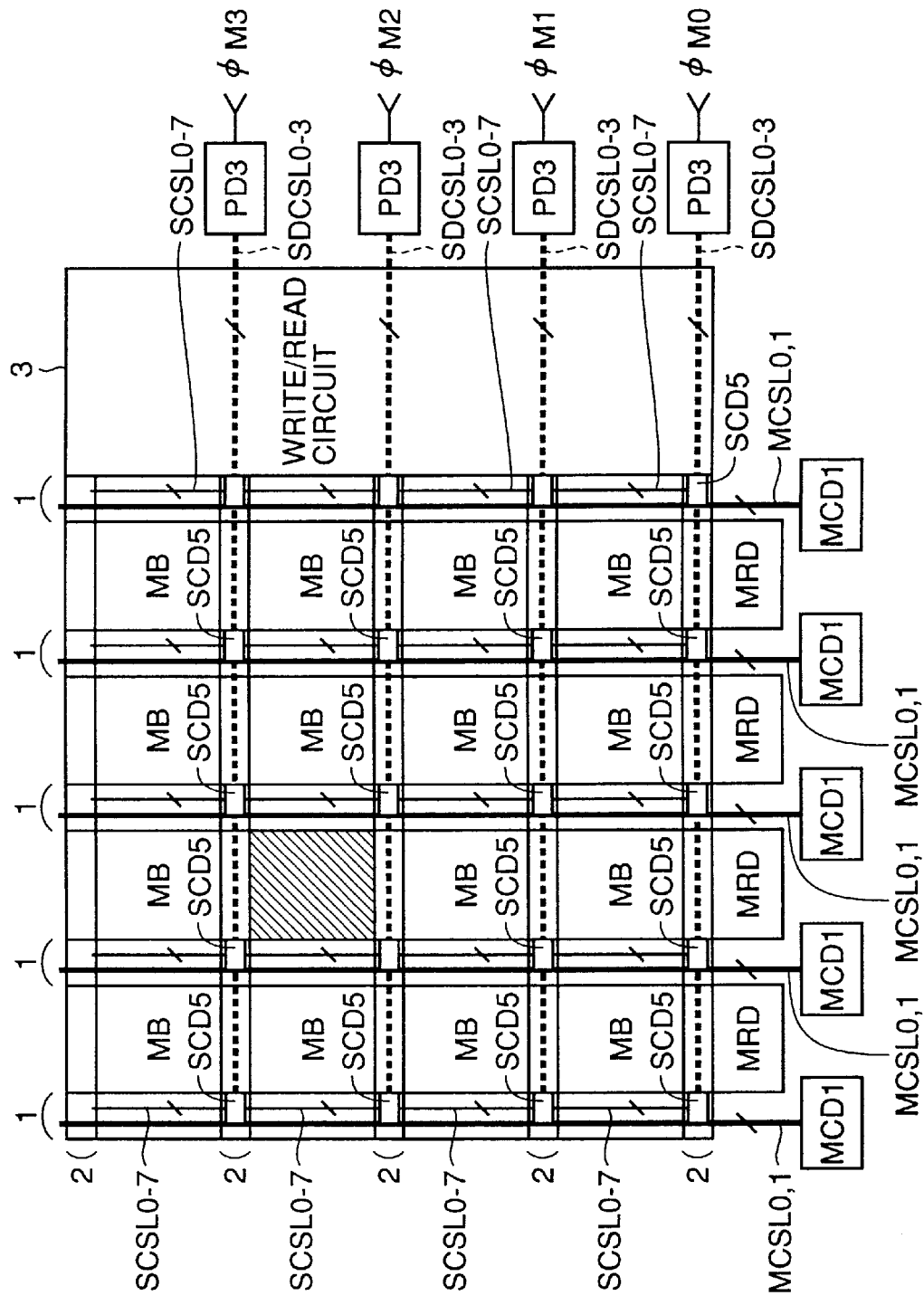
FIG. 9 is a block diagram showing a configuration of a DRAM according to the third embodiment of the present invention.

FIG. 9 is a block diagram showing a configuration of a DRAM according to the third embodiment of the present invention. In FIG. 9, this DRAM is provided with sub decoder column selecting lines SDCSL0 to SDCSL3 and a predecoder PD3 corresponding to each of sub decoder zones 2 in the first to fourth columns from the bottom. The four predecoders PD3 are respectively activated when write mask signals φM0 to φM3 are at the "L" level, and inactivated when write mask signals φM0 to φM3 are at the "H" level. An activated predecoder PD3 selects one sub decoder column selecting line from four sub decoder column selecting lines SDCSL0 to SDCSL3 in accordance with a column address signal, to set the selected sub decoder column selecting line to be at the selected level of the "H" level. An inactivated predecoder PD3 fixes four sub decoder column selecting lines SDCSL0 to SDCSL3 to the non-selected level of the "L" level.

Figure 10:
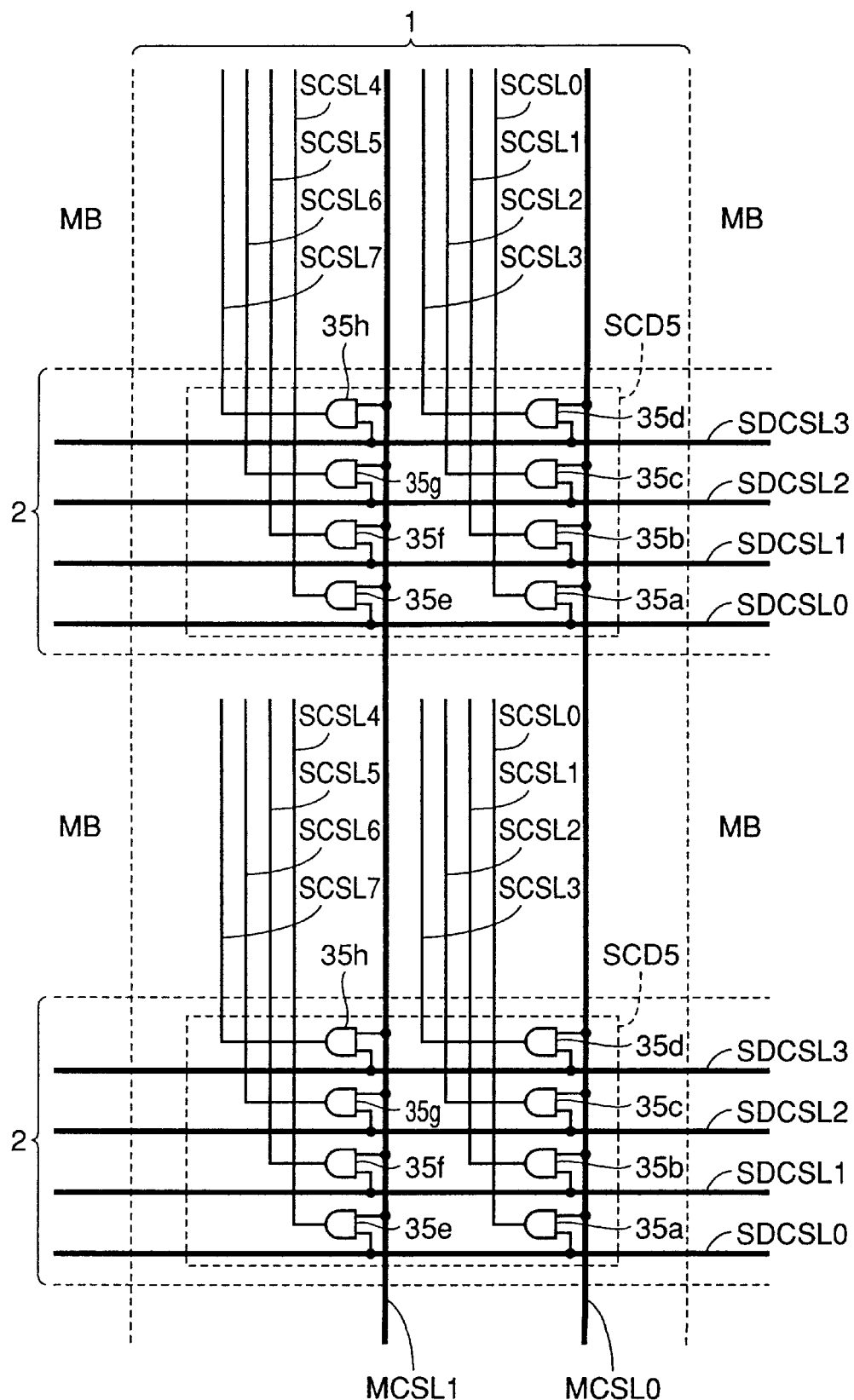
FIG. 10 is a circuit diagram showing a configuration of a sub column decoder shown in FIG. 9.

Further, the DRAM is provided with a sub column decoder SCD5 at each of the crossing portions of sub decoder zones 2 in the first to fourth columns from the bottom and five sense amplifier zone 1. Sub column decoder SCD5 includes AND gates 35a to 35h, as shown in FIG. 10.

One input node of each of AND gates 35a to 35d is connected to main column selecting line MCSL0, the other input nodes thereof are respectively connected to sub decoder column selecting lines SDCSL0 to SDCSL3, and the output nodes thereof are respectively connected to sub column selecting lines SCSL0 to SCSL3. One input node of each of AND gates 35e to 35h is connected to main column selecting line MCSL1, the other output nodes thereof are respectively connected to sub decoder column selecting lines SDCSL0 to SDCSL3, and the output nodes thereof are respectively connected to sub column selecting lines SCSL4 to SCSL7.

When one main column selecting line (e.g. MCSL0) of the two main column selecting lines MCSL0 and MCSL1 is set to be at the selected level of the "H" level, and also one sub decoder column selecting line (e.g. SDCSL0) of the four sub decoder column selecting lines SDCSL0 to SDCSL3 is set to be at the selected level of the "H" level, AND gate 35a outputs the "H" level, setting sub column selecting line SCSL0 to be at the selected level of the "H" level.

In the third embodiment, in addition to attainment of the same effect as that of the first embodiment, a write mask operation inhibiting writing of data into a desired memory block MB (e.g. the shaded portion in FIG. 9) can be realized.

Further, a preamplifier and a write driver within write/read circuit 3 corresponding to data input/output line pair IO, /IO in a non-selected memory block MB column can be inactivated, so that power consumption can be reduced.

Fourth Embodiment

Figure 11:
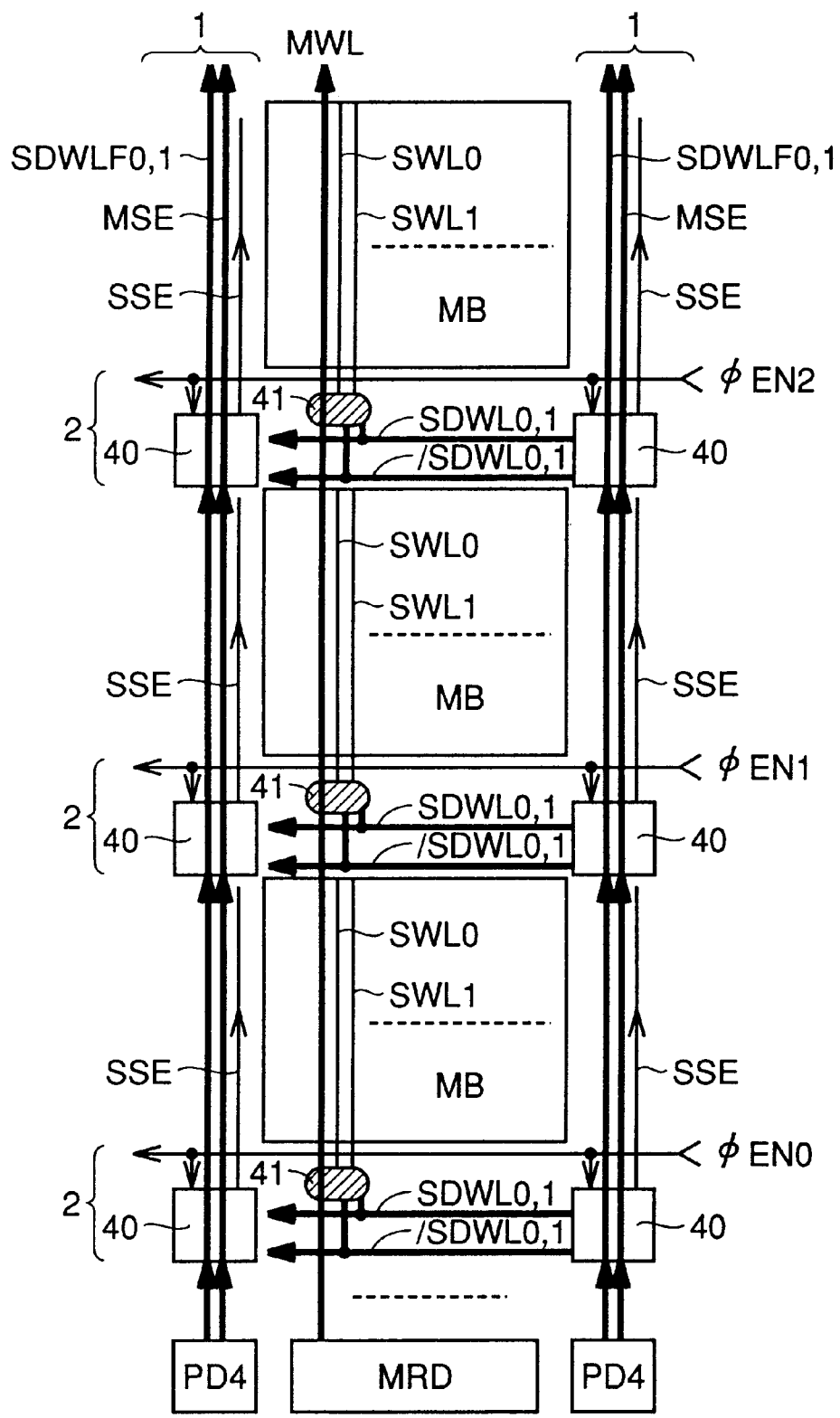
FIG. 11 is a block diagram showing a substantial part of a DRAM according to the fourth embodiment of the present invention.

Though only the column side was subjected to partial operation in the third embodiment, the row side can also be partly operated at the same time. FIG. 11 is a block diagram showing a substantial part of a DRAM according to the fourth embodiment of the present invention. In FIG. 11, the DRAM is provided with three signal transmission lines for transmitting signals SDWLFO, SDWLF1 and MSE and with a predecoder PD4, corresponding to each memory block MB row. The three signal transmission lines extend along the length of sense amplifier zone 1 on one side of a corresponding memory block MB row, and one end of each of the signal transmission lines is connected to predecoder PD4. Predecoder PD 4 sets one of the signals SDWLF0 and SDWLF1 to be at the activated level of the "H" level in accordance with a row address signal, and also sets main sense amplifier activation signal MSE to be at the activated level of the "H" level in response to that a corresponding memory block MB row has been designated by the row address signal.

Figure 12:
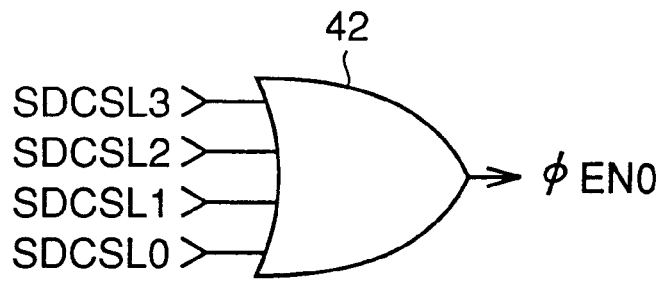
FIG. 12 is a circuit diagram for illustrating a method of generating a signal φEN0 shown in FIG. 11.

Four signal transmission lines for transmitting signals φEN1 to φEN4 are respectively provided corresponding to four memory block MB columns. Each of the four signal transmission lines extends along the length of sub decoder zone 2 on one side of each of four memory block MB columns. As shown in FIG. 12, signal φEN0 is an output signal of an OR gate 42 outputting the "H" level when at least one of the four corresponding sub decoder column selecting lines SDCSL0 to SDCSL3 is set to be at the selected level of the "H" level. The other signals φEN1 to φEN3 are generated in a similar manner to that of signal φEN0. Therefore, when write mask signals φM0 to φM3 are set to be at the "H" level, signals φEN0 to φEN3 will be at the "L" level.

Five signal transmission lines for transmitting signals SSE, SDWL0, /SDWL0, SDWL1 and /SDWL1, and a signal generating circuit 40 are provided corresponding to each memory block MB. A signal transmission line for sub sense amplifier activation signal SSE is arranged at sense amplifier zone 1 on one side of a corresponding memory block MB, and one side of the signal transmission line is connected to signal generating circuit 40. The signal transmission lines for signals SDWL0, /SDWL0 and SDWL1, /SDWL1 are arranged at sub decoder zone 2 on one side of a corresponding memory block MB, and one end of each of the signal transmission lines is connected to signal generating circuit 40.

Figure 13:
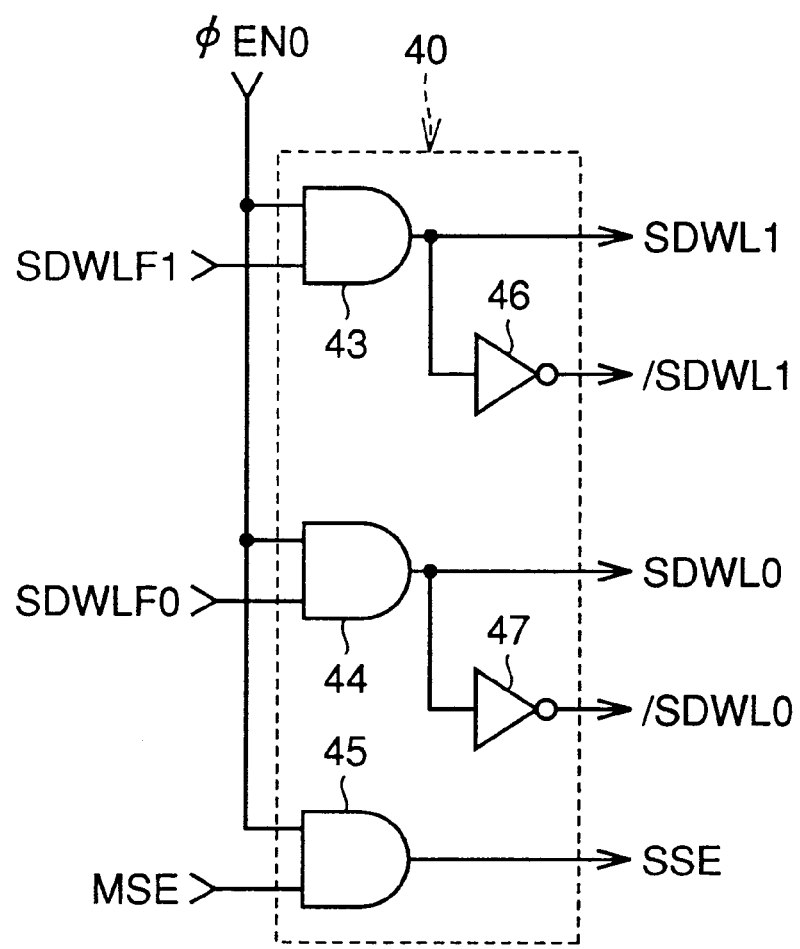
FIG. 13 is a circuit diagram showing a configuration of a signal generating circuit shown in FIG. 11.

As shown in FIG. 13, signal generating circuit 40 includes AND gates 43 to 45 and inverters 46 and 47. One input node of each of AND gates 43 to 45 receives a corresponding signal φEN0, and the other input nodes thereof respectively receive signals SDWLF1, SDWLF0 and MSE. Output signals of AND gates 43 to 45 will be signals SDWL1, SDWL0 and SSE, respectively. Signals SDWL1 and SDWL0 are respectively inverted at inverters 46 and 47 to be signals /SDWL1 and /SDWL0.

When signal φEN0 is at an inactivated level of the "L" level, signal generating circuit 40 is inactivated, fixing signals SDWL1, SDWL0 and SSE all at the inactivated level of the "L" level, while fixing signals /SDWL1, /SDWL0 both at the inactivated level of the "H" level.

When signal φEN0 is set to be at the activated level of the "H" level, signal generating circuit 40 is activated. When signal SDWLF1 is set to be at the activated level of the "H" level, signals SDWL1, /SDWL1 will be at the activated levels of the "H" level and the "L" level, respectively. When signal SDWLF0 is set to be at the activated level of the "H" level, signals SDWL0, /SDWL0 will be the activated levels of the "H" level and the "L" level, respectively. When signal MSE is set to be at the activated level of the "H" level, signal SSE will be at the activated level of the "H" level. Signal SSE is applied to each corresponding sense amplifier SA. Sense amplifier SA is activated in response to that signal SSE is set to be at the "H" level, i.e. the activated level. Signals SDWL0, /SDWL0, and SDWL1, /SDWL1 are applied to a corresponding sub row decoder 41.

Figure 14:
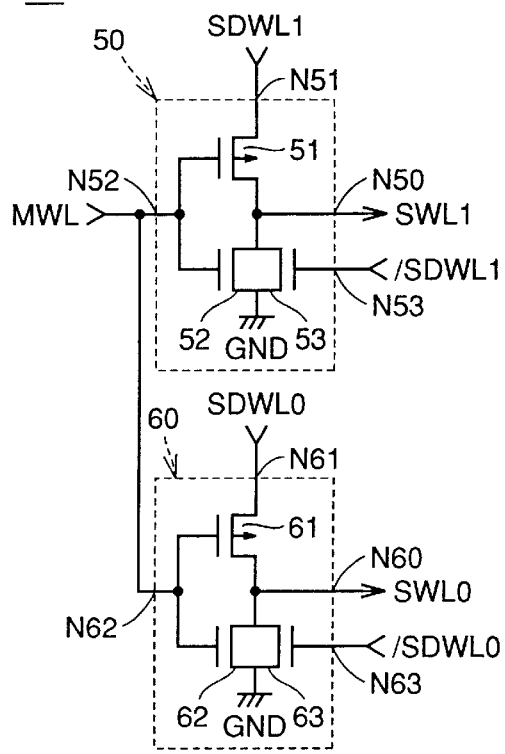
FIG. 14 is a circuit diagram showing a configuration of a sub row decoder shown in FIG. 11.

Each memory block MB is provided with two sub word lines SWL0 and SWL1, corresponding to each main word line MWL. One end of each of sub word lines SWL0 and SWL1 is connected to a corresponding sub row decoder 41. Sub row decoder 41 includes two source follower circuits 50 and 60, as shown in FIG. 14. Source follower circuit 50 includes a P-channel MOS transistor 51 and N-channel MOS transistors 52, 53, and source follower circuit 60 includes a P-channel MOS transistor 61 and N-channel MOS transistors 62, 63.

Input nodes N52, N62 of source follower circuits 50, 60 are both connected to main word line MWL, control nodes N51, N61 of the circuits respectively receive signals SDWL1, SDWL0, inversion control nodes N53, N63 thereof respectively receive signals /SDWL1, /SDWL0, and output nodes N50, N60 thereof are respectively connected to sub word lines SWL1, SWL0.

When main word line MWL and signal SDWL1 are both set to be at the "H" level and signal /SDWL1 is set to be at the "L" level, sub word line SWL1 will be at the selected level of the "H" level. When at least one of main word line MWL and signal SDWL1 is at the "L" level, sub word line SWL1 will be at the non-selected level of the "L" level.

When main word line MWL and signal SDWL0 are both set to be at the "H" level whereas signal /SDWL0 is set to be at the "L" level, sub word line SWL0 will be at the selected level of the "H" level. When at least one of main word line MWL and signal SDWL0 is at the "L" level, sub word line SWL0 will be at the non-selected level of the "L" level. The other configurations and operations are the same as the ones described in the third embodiment, so that the description thereof will not be repeated.

In the fourth embodiment, row selecting operation is performed only in a memory block MB in which one sub decoder column selecting line of corresponding four sub decoder column selecting lines SDCSL0 to SDCSL3 is set to be at the selected level of the "H" level, so that power consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a plurality of memory blocks arranged in rows and columns, each of the plurality of memory blocks including a plurality of memory cells arranged in rows and columns, a word line provided corresponding to each of the rows and a bit line pair provided corresponding to each of the columns;

a row selecting circuit selecting one memory block row from a plurality of memory block rows and one word line from a plurality of word lines of each of the memory blocks included in the selected memory block row in accordance with a row address signal, and setting the selected word line to a selected level to activate each of the memory cells corresponding to the selected word line;

a column selecting circuit selecting one bit line pair from a plurality of bit line pairs of each memory block included in the memory block row selected by said row selecting circuit, in accordance with a column address signal; and a write/read circuit writing/reading data in each memory cell activated by said row selecting circuit via each bit line pair selected by said column selecting circuit;

said plurality of memory blocks are separated and also surrounded by a plurality of first zonal regions each extending in a first direction and by a plurality of second zonal regions each extending in a second direction orthogonal to said first direction;

said column selecting circuit including a plurality of first signal transmission lines provided corresponding to each of the memory block rows and arranged to extend along the length of a first zonal region adjacent to a corresponding memory block row, a plurality of second signal transmission lines provided corresponding to each of the memory block columns and arranged to extend along the length of a second zonal region adjacent to a corresponding memory block column, a first decoder provided corresponding to each of the memory block rows and generating a first predecode signal based on said column address signal to apply the first predecode signal to a plurality of corresponding first signal transmission lines, a second decoder provided corresponding to each of the memory block columns and generating a second predecode signal based on said column address signal to apply the second predecode signal to a plurality of corresponding second signal transmission lines, and a third decoder provided corresponding to each memory block and arranged at a crossing portion of the first and second zonal regions adjacent to a corresponding memory block, and selecting one bit line pair from a plurality of bit line pairs of the corresponding memory block based on the first predecode signal from the plurality of corresponding first signal transmission lines and the second predecode signal from the plurality of corresponding second signal transmission lines.

2. The semiconductor memory device according to claim 1, wherein said first predecode signal includes a plurality of first signals respectively applied to said plurality of first signal transmission lines;

said second predecode signal includes a plurality of second signals respectively applied to said plurality of second signal transmission lines;

said first decoder selects one first signal from said plurality of first signals based on said column address signal to set the selected first signal to be at an activated level; and said second decoder selects one second signal from said plurality of second signals based on said column address signal to set the selected second signal to be at the activated level.

3. The semiconductor memory device according to claim 2, wherein said column selecting circuit further includes a plurality of column selecting lines provided respectively corresponding to a plurality of bit line pairs in each memory block and arranged at a first zonal region adjacent to a corresponding memory block; and said third decoder includes a plurality of logic circuits respectively provided corresponding to said plurality of column selecting lines and arranged at a plurality of crossing portions of said plurality of first signal transmission lines and said plurality of second signal transmission lines, each of the plurality of logic circuits setting a corresponding column selecting line to be at a selected level in response to that a first signal from a corresponding first signal transmission line and a second signal from a corresponding second signal transmission line are both set to be at the activated level;

said semiconductor memory device further comprising a column selection gate provided corresponding to each of the bit line pairs and connected between a corresponding bit line pair and said write/read circuit, and conducting in response to that a corresponding column selecting line is set to be at a selected level.

4. The semiconductor memory device according to claim 1, wherein said plurality of first signal transmission lines are paired up to constitute a plurality of first signal transmission line pairs;

said plurality of second signal transmission lines are paired up to constitute a plurality of second signal transmission line pairs;

said first predecode signal includes a plurality of sets of first signals and complementary signals of the first signals respectively applied to said plurality of first signal transmission lines;

said second predecode signal includes a plurality of sets of second signals and complementary signals of the second signals respectively applied to said plurality of second signal transmission lines;

said first decoder selects one set from said plurality of sets of first signals and complementary signals of the first signals based on said column address signal to set the selected set of a first signal and a complementary signal of the first signal to be at a first logic level and a second logic level, respectively; and said second decoder selects one set of said plurality of sets of second signals and complementary signals of the second signals based on said column address signal to set the selected set of a second signal and a complementary signal of the second signal to be at the first logic level and the second logic level, respectively.

5. The semiconductor memory device according to claim 4, wherein said column selecting circuit further includes a plurality of column selecting lines respectively provided corresponding to a plurality of bit line pairs in each memory block and arranged at a first zonal region adjacent to a corresponding memory block; and said third decoder includes a plurality of logic circuits respectively provided corresponding to said plurality of column selecting lines and arranged at a plurality of crossing portions of said plurality of first signal transmission line pairs and said plurality of second signal transmission line pairs, each of said plurality of logic circuits setting a corresponding column selecting line to be at a selected level in response to that a first signal and a complementary signal of the first signal from a corresponding first signal transmission line pair are set to be at a first logic level and a second logic level respectively and that a second signal and a complementary signal of the second signal from a corresponding second signal transmission line pair are set to be at the first logic level and the second logic level respectively;

said semiconductor memory device further comprising a column selection gate provided corresponding to each bit line pair and connected between a corresponding bit line pair and said write/read circuit, and conducting in response to that a corresponding column selecting line is set to be at a selected level.

6. The semiconductor memory device according to claim 1, wherein said plurality of second signal transmission lines are separately arranged at second zonal regions on either side of a corresponding memory block column;

a plurality of second signal transmission lines arranged at one of the second zonal regions are provided in common to memory block columns at either side of the second zonal region;

said third decoder is divided and arranged at a plurality of crossing portions of first zonal regions and second zonal regions adjacent to a corresponding memory block; and a portion of the third decoder arranged at one crossing portion is shared by memory block columns on either side of a second zonal region including the crossing portion.

7. The semiconductor memory device according to claim 1, wherein said plurality of second signal transmission lines are arranged at a second zonal region at one side of a corresponding memory block column.

8. The semiconductor memory device according to claim 7, wherein said second decoder is inactivated in response to that a write mask signal for inhibiting writing of data into each memory cell in a corresponding memory block column is applied.

9. The semiconductor memory device according to claim 8, wherein said column selecting circuit includes a word line driving circuit provided corresponding to each word line of each memory block and arranged at a second zonal region adjacent to a corresponding memory block, and setting a corresponding word line to be at a selected level, in response to that the corresponding word line is selected; and said second decoder further inactivates each corresponding word line driving circuit in response to that said write mask signal is applied.

10. The semiconductor memory device according to claim 9, wherein a plurality of word lines in each memory block are divided into a plurality of groups respectively including N (N is an integer equal to or greater than 2) word lines;

said column selecting circuit further includes a fourth decoder provided corresponding to each of the memory block rows to select one group from a plurality of groups of each corresponding memory block in accordance with said row address signal, and a fifth decoder provided corresponding to each memory block to select one word line from N word lines in each corresponding group in accordance with said row address signal;

said word line driving circuit is activated in response to that a corresponding group is selected by said fourth decoder, and sets a corresponding word line to be at a selected level in response to that the corresponding word line is selected by said fifth decoder; and said second decoder inactivates each corresponding fifth decoder in response to that said write mask signal is applied.

11. The semiconductor memory device according to claim 10, wherein said row selecting circuit further includes a plurality of main word lines provided corresponding to each of the memory block rows and arranged to cross a plurality of corresponding memory blocks, and respectively provided corresponding to a plurality of groups of each corresponding memory block, and N third signal transmission lines provided corresponding to each memory block and arranged at a second zonal region adjacent to a corresponding memory block, and respectively provided corresponding to N word lines of each corresponding group;

said fourth decoder sets a main word line corresponding to a selected group to be at an activated level;

said fifth decoder sets a third signal transmission line corresponding to a selected word line to be at a selected level; and said word line driving circuit is activated in response to that a corresponding main word line is set to be at the activated level, and sets a corresponding word line to be at a selected level in response to that a corresponding third signal transmission line is set to be at the selected level.

* * * * *